United States Patent

Annapragada et al.

[11] Patent Number: 6,140,221
[45] Date of Patent: Oct. 31, 2000

[54] METHOD FOR FORMING VIAS THROUGH POROUS DIELECTRIC MATERIAL AND DEVICES FORMED THEREBY

[75] Inventors: Rao Venkateswara Annapragada; Subhas Bothra, both of San Jose, Calif.

[73] Assignee: Philips Electronics North America Corp., Tarrytown, N.Y.

[21] Appl. No.: 09/124,603

[22] Filed: Jul. 29, 1998

[51] Int. Cl.[7] .................................................. H01L 21/4763
[52] U.S. Cl. ......................... 438/622; 438/763; 437/195; 437/238; 437/763
[58] Field of Search .................................. 438/622, 763; 437/763, 195, 238

[56] References Cited

U.S. PATENT DOCUMENTS

| | | | |
|---|---|---|---|
| 5,470,802 | 11/1995 | Gnade et al. | 437/238 |
| 5,472,913 | 12/1995 | Havemann et al. | 437/195 |
| 5,488,015 | 1/1996 | Havemann et al. | 438/624 |
| 5,519,250 | 5/1996 | Numata | 257/632 |
| 5,525,857 | 6/1996 | Gnade et al. | 313/309 |
| 5,527,737 | 6/1996 | Jeng | 438/623 |
| 5,548,159 | 8/1996 | Jeng | 257/634 |
| 5,561,318 | 10/1996 | Gnade et al. | 257/638 |
| 5,661,344 | 8/1997 | Havemann et al. | 257/758 |
| 5,665,849 | 9/1997 | Cho | 528/31 |
| 5,723,368 | 3/1998 | Cho et al. | 437/763 |

OTHER PUBLICATIONS

List, R.S. et al., "Integration of Ultra–Low–k Xerogel Gap-fill Dielectric for High Performance Sub–0.18 $\mu$m Interconnects," 1997 Symposium on VLSI Technology Digest of Technical Papers, pp. 77–78 (1997).

Primary Examiner—Richard Elms
Assistant Examiner—Pho Luu

[57] ABSTRACT

A semiconductor device has a device layer, a conductive structure, such as a conductive line, disposed over the device layer, and a porous dielectric layer disposed over the device layer and the conductive structure. At least one via is formed through the porous dielectric layer to the conductive structure with a second dielectric material formed along sidewalls of the via. Often, the porous dielectric layer includes a hydrophobic aerogel material having silicon-hydrogen bonds. One exemplary method of making the semiconductor device includes forming a conductive structure over a device layer of the semiconductor device and then forming a porous dielectric layer over the device layer and the conductive structure. A first via is formed through the porous dielectric layer to the conductive structure. The first via is filled with a second dielectric material that is less porous than the porous dielectric layer and then a second via is formed through the second dielectric material to the conductive structure.

15 Claims, 7 Drawing Sheets

METHOD FOR FORMING VIAS THROUGH POROUS DIELECTRIC MATERIAL AND DEVICES FORMED THEREBY

FIELD OF THE INVENTION

The present invention is, in general, directed to a method for forming vias through a porous dielectric layer of a semiconductor device and semiconductor devices formed thereby. More particularly, the present invention relates to forming a first via in the porous dielectric layer, filling the first via with a less porous dielectric material, and then forming a second via through the less porous dielectric material. The present invention is particularly useful for porous dielectric layers that include aerogel materials.

BACKGROUND OF THE INVENTION

Semiconductor devices are typically formed on a semiconductor substrate and often include multiple levels of patterned and interconnected layers. For example, many semiconductor devices have multiple layers of conductive lines (e.g., interconnects). Conductive lines or other conducting structures, such as gate electrodes, are typically separated by dielectric material (i.e., insulating material) and may be coupled together, as needed, by vias through the dielectric material. The dielectric material may also be used to separate conducting structures, such as conductive lines and gate electrodes, from other conducting structures in the same layer. In addition, dielectric materials may be used in other contexts within the semiconductor device.

The dielectric material typically isolates conducting structures. There is, however, an inherent capacitance formed between conductive lines or other conducting structures separated by dielectric material. This capacitance can negatively impact device properties or parameters including, for example, device speed. Therefore, it is desirable to reduce this capacitance.

Capacitance is a function, at least in part, of the surface area of the conducting structures and the dielectric constant of the dielectric material. Using a dielectric material with a relatively low dielectric constant is one method for reducing the capacitance. One common dielectric material is silicon dioxide, which has a dielectric constant of approximately 3.9. Silicon dioxide can be formed or deposited by a variety of methods, including, for example, thermal oxidation of a silicon layer or substrate and chemical vapor deposition (CVD) using a material such as tetraethyl orthosilicate (TEOS).

Silicon dioxide dielectric materials can also be formed using xerogels, such as spin-on glasses (SOG) including, for example, silicate and siloxane materials. In conventional spin-on glass processing, a silicate or siloxane precursor material is mixed with a solvent and deposited on a device layer of the semiconductor device. The solvent is then evaporated, resulting in a relatively dense dielectric material.

Lower dielectric constants can be achieved by increasing the porosity of the dielectric material. Gases, such as air, within the pores of the dielectric material typically have a much lower dielectric constant than the dielectric material itself. One type of porous dielectric material is a dielectric aerogel formed by supercritical evaporation of a solvent from a solution containing a dielectric material or a precursor material that can be converted into a dielectric material. Conventional silicon dioxide aerogels are formed using a dielectric material or a precursor material, such as TEOS or a spin-on glass. These conventional silicon dioxide aerogels are highly porous materials with dielectric constants ranging from about 1.1 to 2.0 depending on the porosity and structure of the material.

While aerogels do have low dielectric constants, the porosity of aerogels makes these materials fragile. Vias etched through a dielectric aerogel layer often have rough, pitted, anisotropic profiles. For example, the sidewalls of the via may be sloped or bowed. The non-uniformity in the profile of the via results in problems during the subsequent deposition of conducting material. Furthermore, conductive material deposited in the vias may more readily diffuse into the dielectric aerogel layer because of its porosity. In addition, the high surface area and porosity of the dielectric aerogel layer, as well as the hydrophilicity of many conventional aerogels, can lead to degradation of the aerogel and/or conductive material as a result of chemical interaction between the conductive material and the aerogel or compounds, such as water, adsorbed in the aerogel. Therefore, there is a need for new via structures and methods for their production for use with semiconductor devices having dielectric aerogel layers.

SUMMARY OF THE INVENTION

Generally, the present invention relates to methods for forming vias through porous dielectric layers, and, in particular, dielectric layers formed using aerogel materials, and semiconductor devices formed thereby. One embodiment is a method of forming a semiconductor device. A conductive structure is formed over a device layer of the semiconductor device and then a porous dielectric layer is formed over the device layer and the conductive structure. A first via is formed through the porous dielectric layer to the conductive structure. The first via is filled with a second dielectric material that is less porous than the porous dielectric layer and then a second via is formed through the second dielectric material to the conductive structure.

Another embodiment of the invention is a semiconductor device formed using this method.

Yet another embodiment of the invention is a semiconductor device having a device layer, a conductive structure disposed over the device layer, and a porous dielectric layer disposed over the device layer and the conductive structure. At least one via is formed through the porous dielectric layer to the conductive structure with a second dielectric material formed along sidewalls of the via. Often, the porous dielectric layer includes a hydrophobic aerogel material having silicon-hydrogen bonds.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
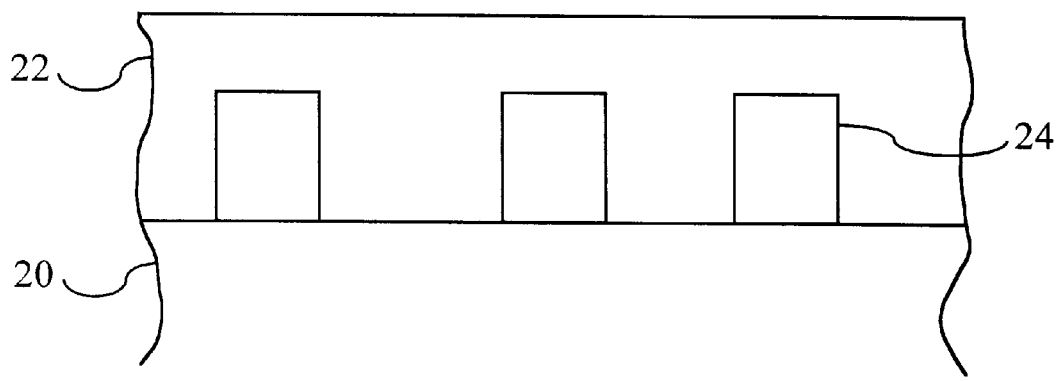
FIGS. 1A–1F illustrate an exemplary process for forming a semiconductor device, according to the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE PREFERRED EMBODIMENT

The present invention is believed to be applicable to semiconductor devices having porous dielectric layers, including, for example, porous dielectric layers made using aerogel materials. In particular, the present invention is directed to the formation of via structures through porous dielectric layers in semiconductor devices. While the present invention may not be so limited, an appreciation of various aspects of the invention will be gained through a discussion of the examples provided below.

One exemplary method for forming a via through a porous dielectric layer 22 is illustrated in FIGS. 1A–1F. A porous dielectric layer 22 is formed over a substrate 20 with one or more conductive structures 24 (e.g., conductive lines) disposed on the substrate 20, as illustrated in FIG. 1A. The substrate 20 may be a semiconductor substrate including, for example, doped or undoped silicon. The porous dielectric layer 22 may be formed directly over the semiconductor substrate. Alternatively, the substrate 20 may include one or more layers formed over the semiconductor substrate, including, for example, layers of conductive lines, other conducting layers, and dielectric layers.

The one or more conductive structures 24 can be formed on the substrate 20 by a variety of techniques including, for example, by depositing a layer of conductive material over the substrate 20. The conductive material may include metals, such as, for example, gold, silver, copper, aluminum, titanium, and tungsten. The conductive material may be formed on the substrate 20 using techniques, such as, for example, chemical vapor deposition, physical vapor deposition, coating, sputtering, and plasma deposition. The conductive structures 24 may then be formed by techniques, including, for example, known photolithographic techniques.

The porous dielectric layer 22 may be formed using a variety of dielectric materials ,including, for example, $SiO_2$, SiN, and SiON, and precursor materials that can be converted into dielectric materials, including, for example, tetraethyl orthosilicate (TEOS), hydrogen silsesquioxane (HSQ), spin-on glass (including silicate and siloxane materials), other xerogel dielectrics, and other dielectric or dielectric-generating materials. Hydrogen silsesquioxane or HSQ, as used herein, includes compounds and resins having the formula $(HSi(OH)_x(OR)_yO_{z/2})_n$ where x is an integer from 0 to 2, y is an integer from 0 to 2, z is an integer from 1 to 3, x+y+z=3, n is an integer, and R is an alkyl or substituted alkyl group, including, for example, $HSiO_{3/2}$. Preferably, x is 0, y is 0, n is 1 to 8, and R is C1 to C3 alkyl. HSQ is commercially available as Dow Corning® Flowable Oxide (Dow Corning, Midland, Mich.).

The porous dielectric layer 22 can be formed by a variety of methods. The porous dielectric layer 22 is often formed by converting a precursor material into a dielectric material. The precursor material is converted, for example, by heating the precursor material above a conversion temperature, removing a solvent, and/or reacting the precursor material with another compound. Examples of precursor materials include spin-on glasses, TEOS, and HSQ. For example, spin-on glasses are typically converted in to a dielectric material, such as silicon dioxide, by removal of a solvent. HSQ can be converted into a networked material by, for example, heating HSQ above an network-forming temperature that ranges from, for example, 300 to 400° C.

Typically, however, the porous dielectric layer 22 is formed as an aerogel. The formation of an aerogel material for the dielectric layer 22 includes evaporating a solvent from a precursor or dielectric material under supercritical conditions. Typically, the aerogel material is formed by, first, combining the precursor or dielectric material and the solvent. The precursor or dielectric material may be solvated in, dispersed in, or otherwise combined with the solvent. A variety of solvents may be used including, for example, benzene, toluene, alkanes, ketones, alcohols, esters, and ethers. Such solvents include, for example, methyl isobutyl ketone and hexane. The choice of solvent include considerations such as the solubility of the precursor or dielectric material and the critical temperature and pressure of the solvent.

The dielectric or precursor material/solvent combination is applied to the substrate 20. In conventional xerogel processing, the solvent is removed by heating the solvent until the solvent changes phase from a liquid to a vapor and evaporates. This conventional processing causes a shrinkage in the dielectric layer due to capillary forces exerted on the walls of the pores of the dielectric layer by the unevaporated liquid. The shrinkage of the dielectric layer results in an increased density of the dielectric layer and a consequent increased dielectric constant.

Figure 2:
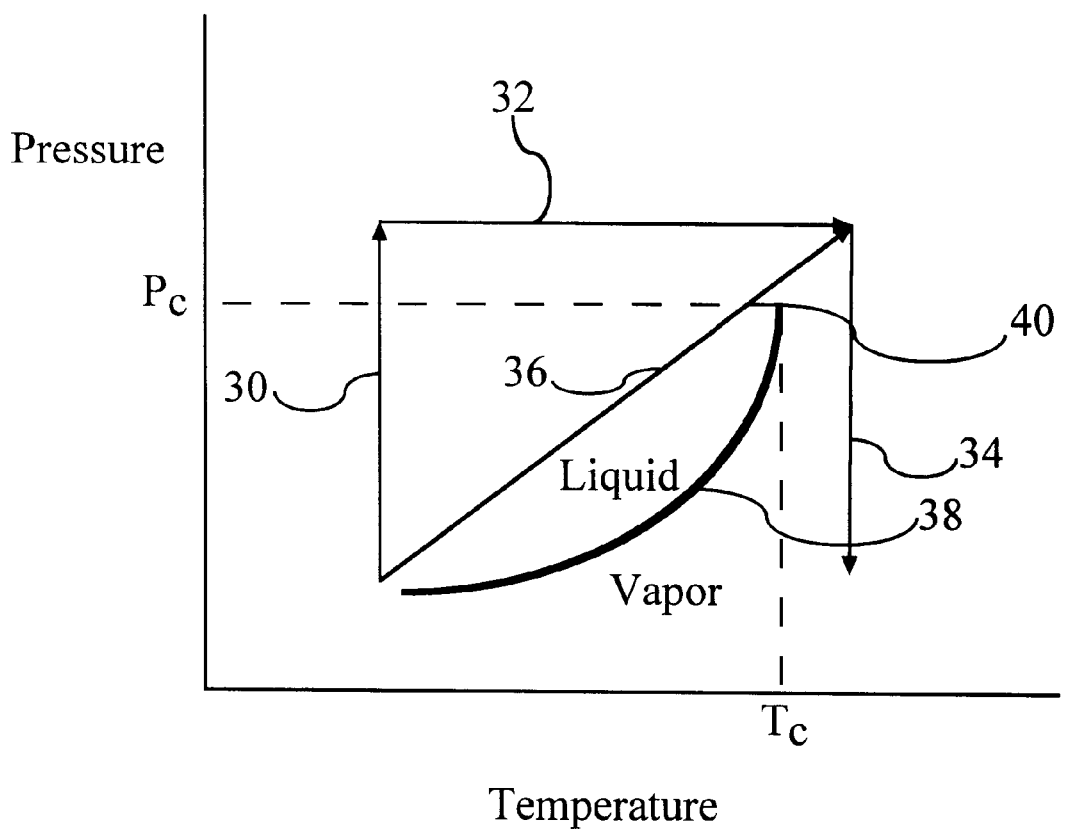
FIG. 2 is a phase diagram of a solvent used in forming one embodiment of a dielectric layer in the exemplary process of FIGS. 1A–1F, the phase diagram illustrates exemplary paths for forming an aerogel material in the dielectric layer.

The aerogel process reduces or eliminates the shrinkage of the dielectric layer because there is no phase transition of the solvent from a liquid to a vapor. A phase boundary is not crossed during the evaporation of the solvent under supercritical conditions. This results in a dielectric material with increased porosity. To illustrate exemplary methods for supercritical evaporation of the solvent, a phase diagram of a typical solvent is shown in FIG. 2. It will be understood that solvents having other phase diagrams may be used. A phase boundary 38 separates the liquid and vapor phases of the solvent. At a critical point 40, corresponding to a critical temperature, $T_c$, and critical pressure, $P_c$, the density of the liquid and vapor phases are the same.

Supercritical evaporation of the solvent includes increasing the pressure and temperature of the solvent above the critical pressure and temperature, respectively, without crossing the phase boundary 38. A pressure greater than the critical pressure, $P_c$, of the solvent is applied to the dielectric or precursor material/solvent combination on the substrate 20, as shown in the phase diagram of FIG. 2. In one embodiment, the pressure is applied before any increase in temperature, as shown, for example, in path 30 of FIG. 2. In another embodiment, the pressure is increased in conjunction with an increase in temperature, as shown, for example, in path 36 of FIG. 2. The paths illustrated in FIG. 2 are exemplary paths only. Other embodiments include periods of simultaneous incremental increases in pressure and temperature and/or other periods of individual incremental increases in temperature or pressure. In any case, the increase in pressure and/or temperature should not cause the solvent to change from a liquid to a vapor by crossing the liquid/vapor phase boundary 38.

In addition to raising the pressure above the critical pressure, the temperature of the dielectric or precursor material/solvent combination is raised above the critical temperature, $T_c$. As described above, in some embodiments, the temperature may be raised simultaneously with the pressure, as indicated, for example, along path 36. In other embodiments, the temperature may be increased after a pressure greater than the critical pressure has been achieved, as illustrated, for example, by path 32 of FIG. 2. In yet other embodiments, the temperature and pressure may be increased incrementally either independently or simultaneously. Typically, the critical pressure is achieved prior to the critical temperature. Otherwise, for many solvents, the liquid/vapor phase boundary would be crossed.

Once the temperature is greater than the critical temperature, the pressure can be reduced, for example, along path 34 of FIG. 2, with the consequent evaporation of the solvent. In some embodiments, the pressure is reduced without any reduction in temperature, as shown in FIG. 2. In other embodiments, the temperature is reduced simultaneously with the pressure. In yet other embodiments, the temperature and pressure are reduced individually or simultaneously in increments. The reduction in temperature and pressure should, however, not cause the solvent to cross the liquid/vapor phase boundary.

The temperatures and pressures used to form the aerogel from the precursor material/solvent combination can be achieved using a variety of devices. Examples of suitable devices include autoclaves, pressure chambers, and other supercritical drying chambers. The temperatures and pressures achieved during the aerogel formation process typically depend on the particular solvent used and the critical temperature and pressure of that solvent. For HSQ, the temperature for forming the aerogel ranges from, for example, 300 to 400° C. For HSQ, the pressure for forming the aerogel ranges from, for example, 30 to 50 atmospheres.

Typically, if the precursor material is converted to a dielectric material by heating (e.g., the conversion of HSQ into a networked material), the temperatures used to supercritically evaporate the solvent are lower than or the same as the temperature at which the precursor material converts into the dielectric material of the porous, hydrophobic, dielectric layer 22. For example, as the solvent is supercritically evaporated, the precursor material can be converted into a porous, hydrophobic, dielectric material, if necessary. For example, if the precursor material is HSQ, the substrate 20 and precursor material are heated to or above the network-forming temperature of HSQ to form the dielectric layer 22. In addition to the porous, hydrophobic, dielectric material, such as, for example, the networked HSQ material, the dielectric layer 22 may include other dielectric materials, such as oxides or nitrides.

In one embodiment, the dielectric layer 22 is porous and contains a hydrophobic aerogel material having silicon-hydrogen bonds. Examples of such dielectric layers and there formation are disclosed in U.S. Patent Application Ser. No. 09/124,285, filed Jul. 29, 1998, Attorney Docket No. M&G 11422.98US01, incorporated herein by reference.

A networked HSQ material typically retains at least some silicon-hydrogen bonds. The ratio of silicon to hydrogen in a networked HSQ material, typically, depends on a variety of factors, including, for example, the temperature at which the networked HSQ material is formed, the starting material, the rate of temperature increase in forming the networked HSQ material, the atmosphere surrounding HSQ during formation of the networked HSQ material (e.g., hydrogen, nitrogen, oxygen, or air), and the pressure at which the networked HSQ material is formed. Preferably, the atmosphere is an oxygen-free ambient. Typically, the ratio of silicon to hydrogen in a networked HSQ material ranges from about 2:1 to about 100:1. Particularly useful networked HSQ materials have a ratio of silicon to hydrogen that ranges from about 2:1 to about 10:1.

The porous, hydrophobic, dielectric layer 22 typically has a dielectric constant of 3.0 or less and often has a dielectric constant of 1.5 or less. Preferably, the dielectric constant ranges from 1.2 to 2.0. The thickness of the resulting dielectric layer 22 varies according to the desired use of the dielectric layer 22. Exemplary thicknesses for many uses range from about 2000 to 6000 angstroms. Thicker and thinner layers may, however, be used. Optionally, after formation, the dielectric layer 22 may be planarized, for example, by chemical, mechanical, or chemical/mechanical polishing.

Figure 1B:
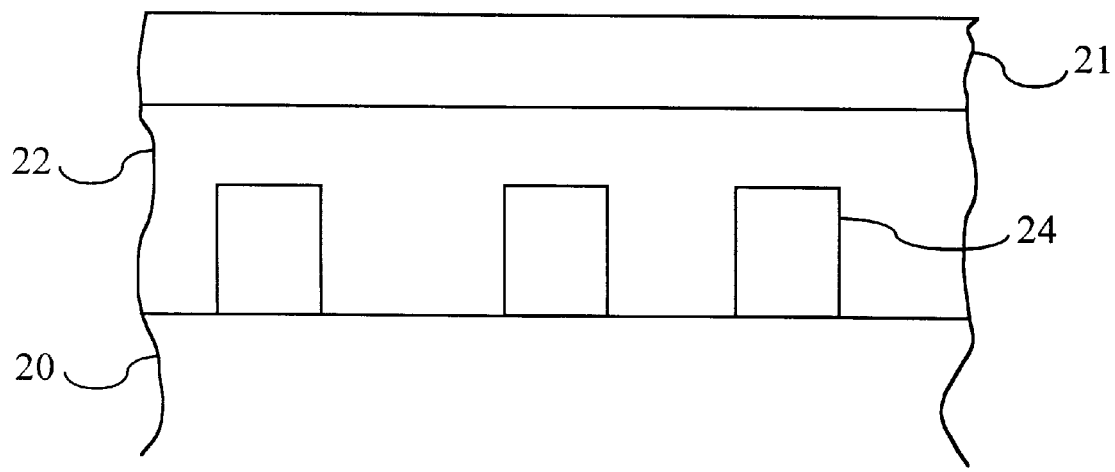

Next, a first photoresist layer 21 is formed over the dielectric layer 22, as illustrated in FIG. 1B. A variety of photoresist materials may be used. Typical photoresist materials are organic compounds that undergo a chemical change upon exposure to light having a particular wavelength. In some embodiments, a capping layer (not shown) is formed over the dielectric layer 22 prior to forming the photoresist layer 21. The capping layer may protect the dielectric layer 22 from reacting with the photoresist layer 21. This capping layer may include dielectric materials, such as silicon dioxide, silicon nitride, silicon oxynitride, and the like and may be generated by techniques such as chemical vapor deposition, physical vapor deposition, coating, spin-on glass techniques, and plasma deposition. The capping layer may have a thickness ranging, for example, from 1000 to 5000 angstroms. Thicker and thinner capping layers may also be used.

Figure 1C:
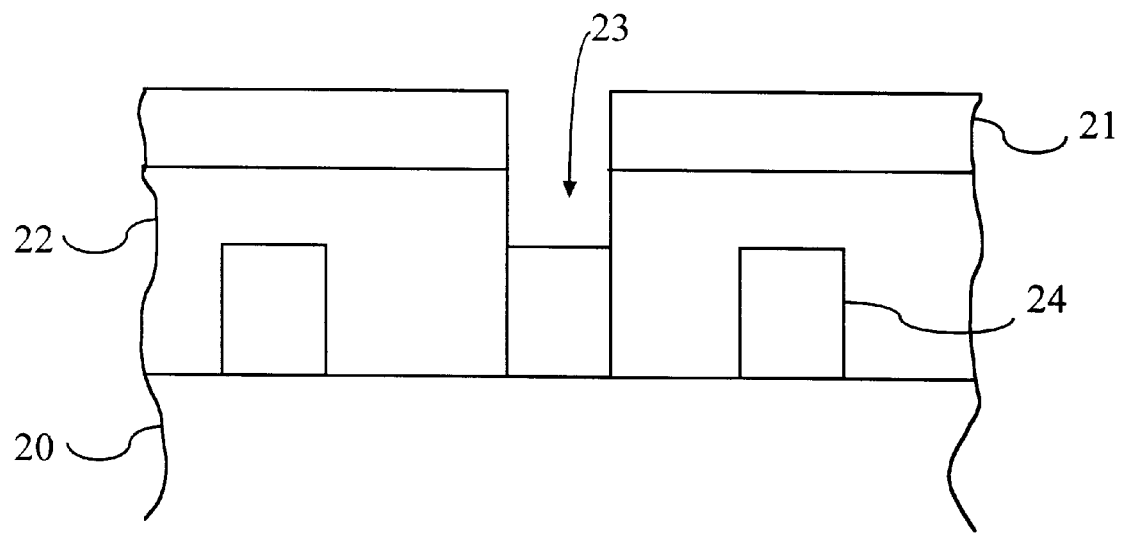
Figure 1D:
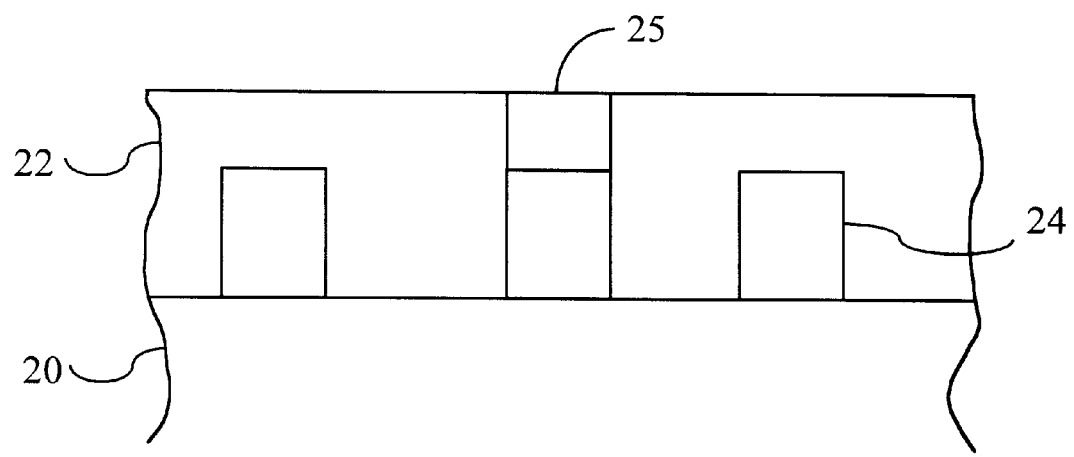

After the first photoresist layer 21 is formed over the dielectric layer 22, the first photoresist layer is patterned according to a desired interconnect pattern, as shown in FIG. 1C. Typically, the first photoresist layer 21 is patterned using photolithographic techniques including illuminating portions of the photoresist layer 21 through a mask having the desired pattern using light having a wavelength that alters the chemical structure of the illuminated portions of the first photoresist layer 21. The first photoresist layer 21 is then developed to remove portions corresponding to one or more first vias 23 or other structures according to the pattern.

The first vias 23 are then formed through the dielectric layer 22 by removal of a portion of the dielectric layer 22, as shown in FIG. 1C. A variety of techniques can be used to remove the portion of the dielectric layer 22 and form the first vias 23, including, for example, wet etching, dry etching, and anisotropic etching techniques. It is often desirable to use anisotropic etching techniques that form relatively straight walls through the dielectric layer 22. Because of the porosity of the dielectric layer 22, the walls of the first via 23 are often pitted, rough, and anisotropic (e.g., bowed), even when the first via 23 is formed using anisotropic etching.

Following the formation of the first via 23, the first photoresist layer 21 is removed and the first via 23 is filled with a second dielectric material 25. This second dielectric material 25 is typically a conventional dielectric material formed using, for example, $SiO_2$, SiN, SiON, TEOS, spin-on glass, other xerogel dielectrics, other dielectric materials, and other precursor materials that are converted into dielectric materials. This second dielectric material 25 may be formed by a variety of techniques including, for example, chemical vapor deposition (CVD), physical vapor deposition, spin-on techniques, and plasma deposition. Particularly useful methods for depositing the second dielectric material 25 include high density plasma CVD (HDPCVD) and sub-atmospheric CVD (SACVD). Once deposited the second dielectric material 25 may be planarized using techniques, such as, chemical, mechanical, and chemical-mechanical polishing or combinations thereof.

Figure 1E:
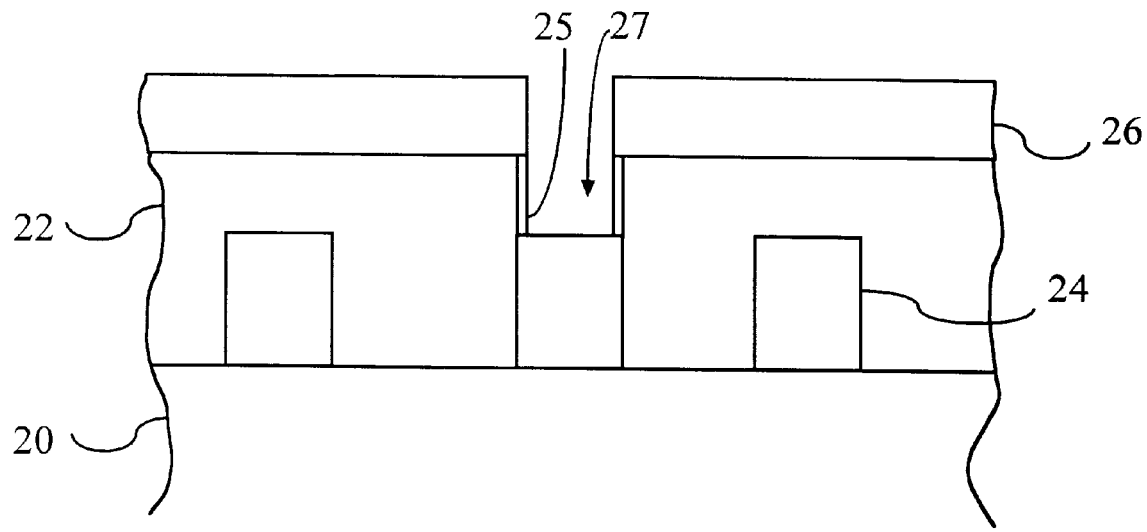

Next, a second photoresist layer 26 is formed over the dielectric layer 22 and the second dielectric material 25, as illustrated in FIG. 1E. The second photoresist layer 26 is patterned and a second via 27 is formed through the second photoresist layer 26 and the second dielectric material 25. The patterning of the second photoresist layer 26 and the formation of the second via 27 may be performed using the same techniques as the patterning of the first photoresist layer 21 and the first via 23. The second via 27 is narrower than the first via 23 so that the second dielectric material 25 covers the walls of the second via 27. This protects the underlying dielectric layer 22 from contact with conductive material that subsequently fills the second via 27. Because the second dielectric material 25 is a denser material, the walls of the second via 27 are more uniform. This provides for more uniform characteristics of the via 27 and the density of the second dielectric material 25 reduces or eliminates problems associated with the deposition of conductive material 28 (see FIG. 1F).

Figure 1F:
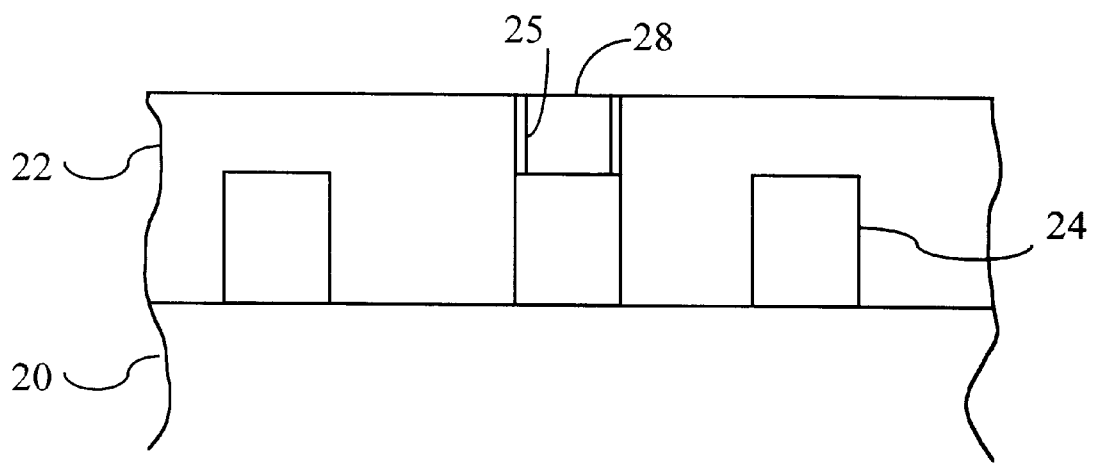

The second photoresist material 26 is then removed and the second via 27 is filled with a conductive material 28 to provide a conductive path to the conductive structure 24 below, as shown in FIG. 1F. The conductive material 28 typically includes, for example, metal, such as, gold, silver, copper, aluminum, titanium, or tungsten, or a conductive compound, such as, for example, titanium nitride or indium tin oxide. The conductive material 28 may be deposited by a variety of techniques including, for example, chemical vapor deposition, coating, physical vapor deposition, sputtering, or plasma deposition.

In some embodiments, a barrier layer (not shown) is formed along the walls of the second via 27 prior to filling with the conductive material. The barrier layer is typically made using a conductive material, such as, for example, titanium nitride, tantalum, tantalum nitride, tungsten nitride, or combinations thereof. Other materials which are compatible with the second dielectric material 25 and conductive material 28 may also be used. The barrier layer is often formed using a material which is conductive; although typically the material of the barrier layer is not as conductive as the conductive material 28. The thickness of the barrier layer may vary over a wide range. Typical values for the thickness of the barrier layer range from 50 to 1000 angstroms.

The barrier layer typically protects the second dielectric material 25 from interaction with a subsequently deposited conductive material 28. Such interaction may include, for example, chemical reactions between the second dielectric material 25 and the conductive material 28, as well as diffusion of metal atoms from the conductive material 28 into the second dielectric material 25. In addition, by providing a more easily wetted surface for the conductive material 28, the use of the barrier layer may improve the filling of the second vias 27, the adhesion between the second dielectric material 25 and the subsequently formed conductive material 28, and/or the grain structure of the conductive material 28.

After filling the second via 28, the conductive material 28 may optionally be planarized using techniques, such as, for example, chemical, mechanical, or chemical-mechanical polishing or combinations thereof. Further layers may then be deposited, including, for example, other dielectric layers (such as a capping layer to protect the porous dielectric layer 22) or a conductive layer (that may be subsequently patterned into conductive structures that may interconnect with the conductive structures 24 through the conductive material 28 in the second vias 27). Other layers may be formed to complete the construction of the semiconductor device.

Figure 3A:
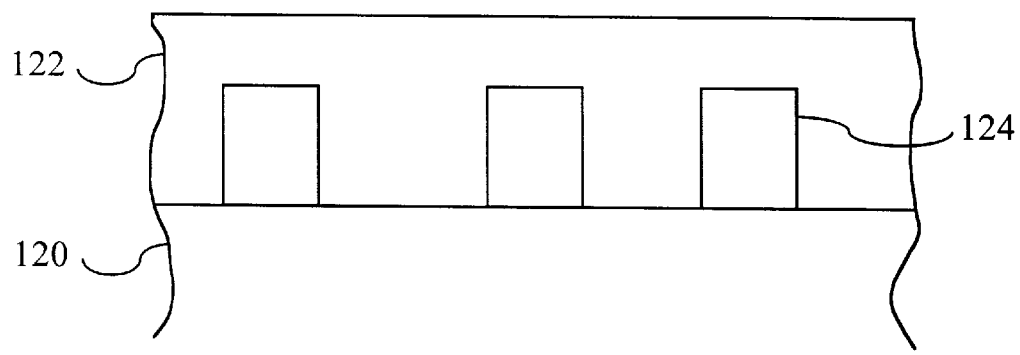
FIGS. 3A–3F illustrate a second exemplary process for forming a semiconductor device, according to the invention.
Figure 3B:
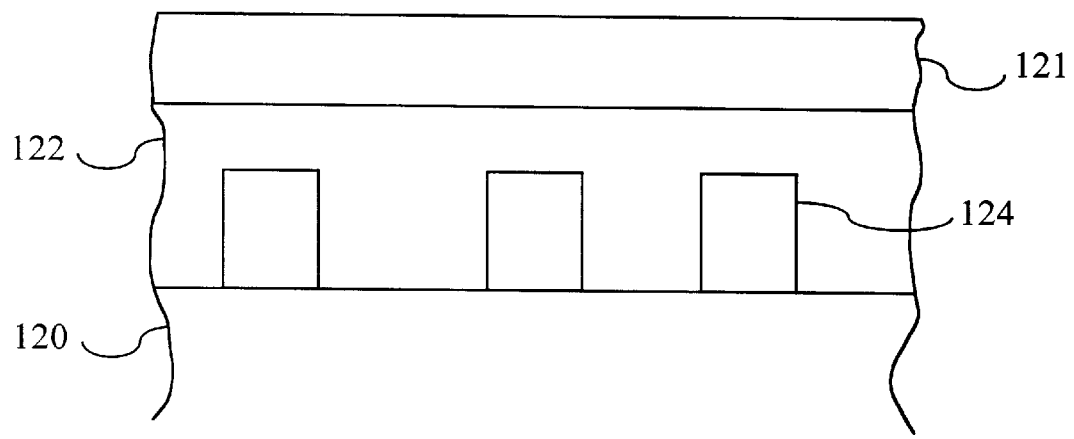
Figure 3C:
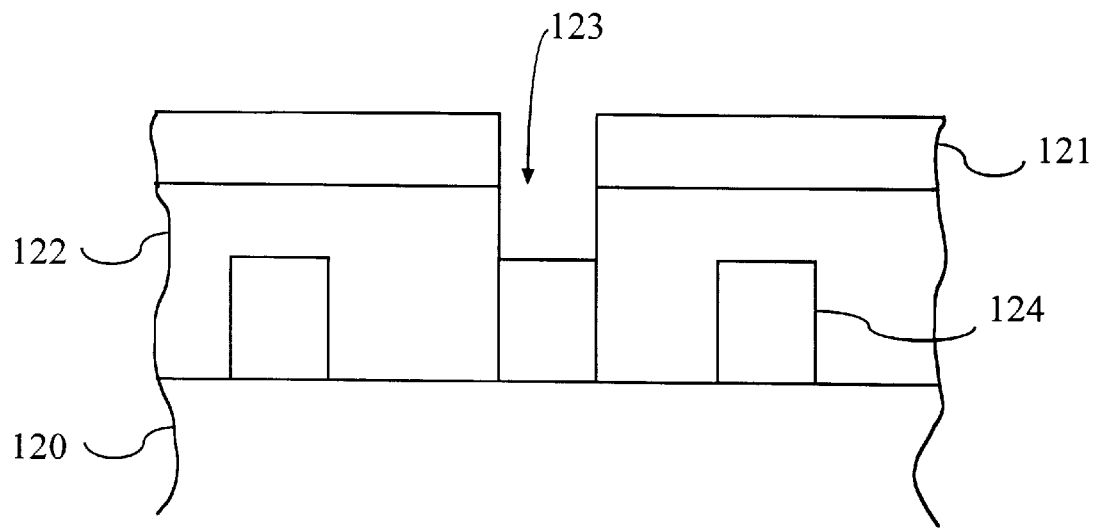

Another exemplary method is illustrated in FIGS. 3A–3F. In this method, a porous dielectric layer 122 is formed over a substrate 120 and one or more conductive structures 124 disposed on the substrate 120, as illustrated in FIG. 3A. A first photoresist layer 121 is formed over the porous dielectric layer 122, as shown in FIG. 3B. The photoresist layer 121 is patterned and a portion of the first photoresist layer 121 and porous dielectric layer 122 are removed to form one or more first vias 123, as shown in FIG. 3C. The techniques and materials for these steps are the same as those described in conjunction with the process steps shown in FIGS. 1A–1C.

Figure 3D:
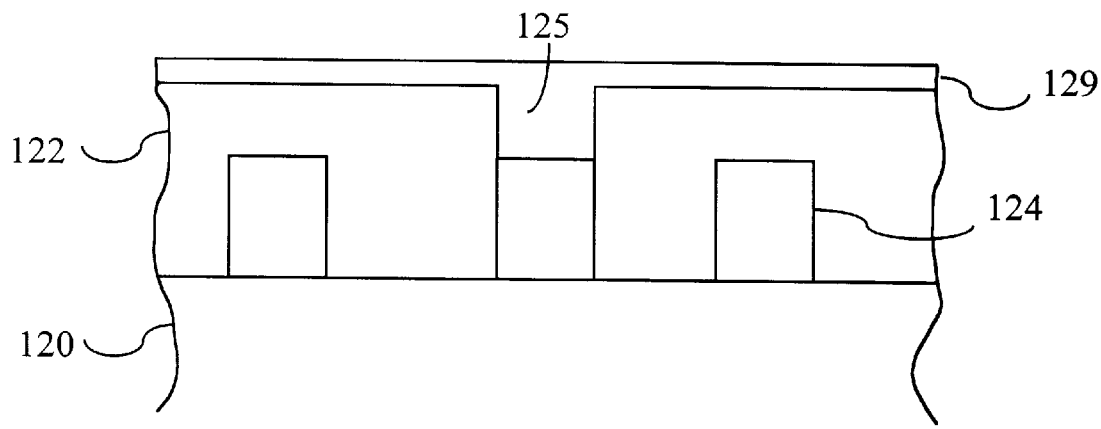

A second dielectric material 125 is deposited within the first via 123 and over the porous dielectric layer 122, as shown in FIG. 3D. The materials and methods for forming the second dielectric material are the same as discussed in conjunction with the process steps shown in FIG. 1D. In this exemplary method, the second dielectric material 125 is typically planarized to leave a second dielectric layer 129 over the porous dielectric layer 122. The second dielectric layer 129 can be used as a capping layer to provide structural support to the porous dielectric layer 122 and/or to protect the porous dielectric layer 122 from subsequently deposited layers, such as other dielectric layers and/or layers of conductive material. The second dielectric layer 129 may have a thickness ranging, for example, from 1000 to 5000 angstroms above the porous dielectric layer 122. Thicker and thinner second dielectric layers may also be used.

Figure 3E:
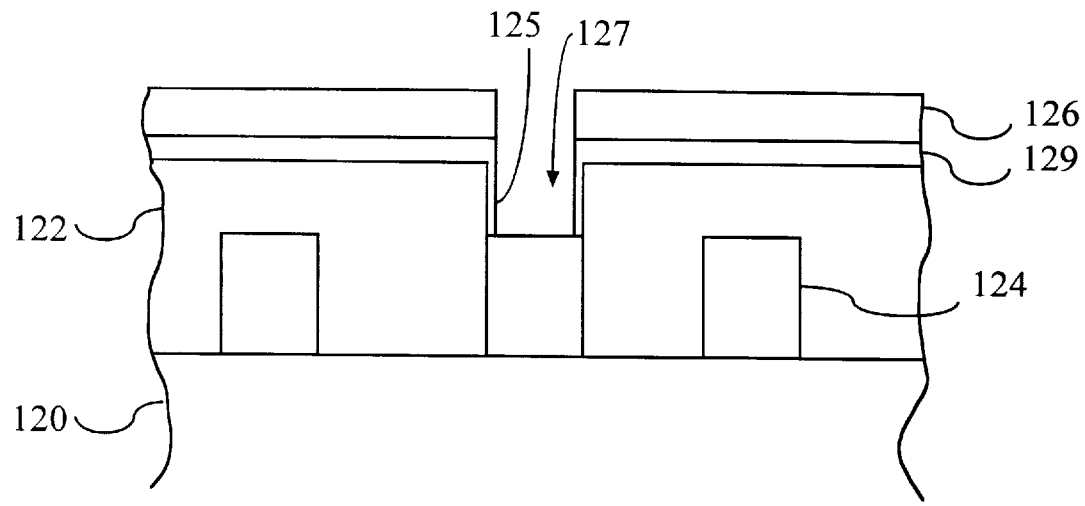
Figure 3F:
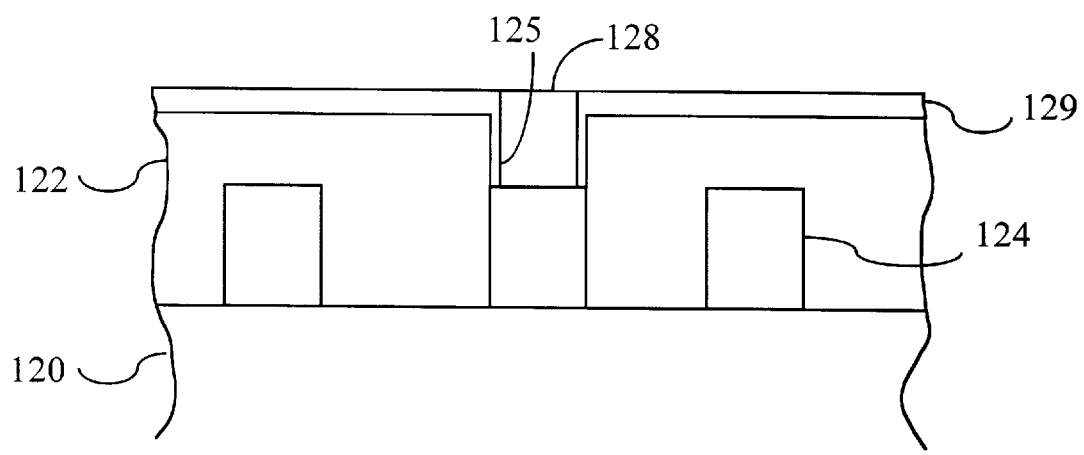

A second photoresist layer 126 is formed over the second dielectric layer 125 and then patterned and a portion of the second photoresist layer 126 is removed, as shown in FIG. 3E. A portion of the second dielectric material 125 is also removed to form a second via 127. The second via 127 is filled with conductive material 128, as shown in FIG. 3F. The methods and techniques for performing these process steps are the same as those described in conjunction with the process steps illustrated in FIGS. 1E and 1F.

Further layers may be deposited, including, for example, a conductive layer (that may be subsequently patterned into conductive structures that may interconnect with the conductive structures 124 through the conductive material 128 in the second vias 127). Other layers may be formed to complete the construction of the semiconductor device.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

We claim:

1. A method of forming a semiconductor device, comprising:

forming at least one conductive structure over a device layer of the semiconductor device;

forming a porous dielectric layer over the device layer and the conductive structure;

forming a first via through the porous dielectric layer to the conductive structure;

filling the first via with a second dielectric material that is less porous than the porous dielectric layer; and forming a second via through the second dielectric material to the conductive structure.

2. The method of claim 1, wherein forming the porous dielectric layer comprises forming a dielectric aerogel material over the device layer and the conductive structure.

3. The method of claim 2, wherein forming a dielectric aerogel material comprises depositing a solution containing a dielectric material and a solvent over the device layer and the conductive structure and removing at least a portion of the solvent under supercritical conditions.

4. The method of claim 2, wherein forming a dielectric aerogel material comprises depositing a solution containing a precursor material and a solvent over the device layer and the conductive structure and removing at least a portion of the solvent under supercritical conditions.

5. The method of claim 4, wherein the dielectric material comprises a spin-on glass.

6. The method of claim 4, wherein forming a dielectric aerogel material further comprises converting the precursor material into a dielectric material.

7. The method of claim 4, wherein the precursor material comprises hydrogen silsesquioxane.

8. The method of claim 1, wherein forming the porous dielectric layer comprises disposing a dielectric material over the device layer and conductive structure or disposing a precursor material over the device layer and conductive structure and converting the precursor material to a dielectric material.

9. The method of claim 1, wherein the porous dielectric layer is hydrophobic.

10. The method of claim 1, wherein the porous dielectric layer comprises a dielectric material having silicon-hydrogen bonds.

11. The method of claim 10, wherein the dielectric material having silicon-hydrogen bonds comprises a dielectric aerogel material.

12. The method of claim 1, further comprising depositing the second dielectric material over the porous dielectric layer to form a second dielectric layer.

13. The method of claim 1, further comprising filling the second via with a conductive material.

14. The method of claim 1, further comprising forming a capping layer over the porous dielectric layer.

15. A method of forming a semiconductor device, comprising:

forming a conductive structure over a device layer of the semiconductor device;

forming a porous dielectric layer over the device layer and the conductive structure, the porous dielectric layer including a hydrophobic aerogel material;

forming a first via through the porous dielectric layer to the conductive structure;

filling the first via with a second dielectric material that is less porous than the porous dielectric layer;

forming a second via through the second dielectric material to the conductive structure, the second via having sidewalls formed of the second dielectric material; and filling the second via with a conductive material.

* * * * *